United States Patent
French

(10) Patent No.: US 7,624,327 B2
(45) Date of Patent: Nov. 24, 2009

(54) FAST DECODER AND METHOD FOR FRONT END OF CONVOLUTIONALLY ENCODED INFORMATION STREAM

(75) Inventor: Catherine A. French, Olympia, WA (US)

(73) Assignee: Sigma Designs, Inc., Milpitas, CA (US)

( * ) Notice: Subject to any disclaimer, the term of this patent is extended or adjusted under 35 U.S.C. 154(b) by 429 days.

(21) Appl. No.: 11/278,536

(22) Filed: Apr. 3, 2006

(65) Prior Publication Data

US 2007/0234176 A1    Oct. 4, 2007

(51) Int. Cl.
*H03M 13/00* (2006.01)
(52) U.S. Cl. .................. 714/755; 714/786; 714/777; 714/795; 714/796
(58) Field of Classification Search ............... 714/755, 714/777, 794–795, 786
See application file for complete search history.

(56) References Cited

U.S. PATENT DOCUMENTS

| | | | |
|---|---|---|---|
| 2003/0227851 A1* | 12/2003 | Furuta et al. ............. | 369/59.22 |
| 2004/0005011 A1* | 1/2004 | Trott et al. .................. | 375/262 |
| 2005/0117519 A1* | 6/2005 | Kwak et al. ................. | 370/236 |
| 2006/0023802 A1* | 2/2006 | Balakrishnan et al. ...... | 375/265 |

* cited by examiner

*Primary Examiner*—Guy J Lamarre
(74) *Attorney, Agent, or Firm*—Nixon Peabody LLP; Aaron Wininger

(57) ABSTRACT

A system and method enable the fast decoding of a front end of data (e.g., a header) that is convolutionally encoded by treating the front end as a block code. The system and method receive the convolutionally encoded data; extract a finite sized block from the data; and decode the extracted block using a block error correction decoding method. A Viterbi decoder can then be used to decode the remainder of the encoded data based on the decoded block.

18 Claims, 2 Drawing Sheets

FAST DECODER AND METHOD FOR FRONT END OF CONVOLUTIONALLY ENCODED INFORMATION STREAM

TECHNICAL FIELD

This invention relates generally to wireless systems, and more particularly, but not exclusively, provides a system and method for decoding a portion of a convolutionally encoded information stream.

BACKGROUND

Many communication systems, particularly wireless systems, employ convolutional codes for mitigation of noise during transmission. A Viterbi decoder is generally used by a receiver to correct errors and extract user information from the convolutionally encoded data stream. A Viterbi decoder is a maximum likelihood decoder, provides excellent bit error rate performance, and easily incorporates soft information into the decoding process. However, Viterbi decoders introduce latency into the design. This latency can be an issue if the communication system employs embedded transmit parameters in the header of each information packet. Often, one or more header parameters need to be decoded before the user data portion of the packet can be processed. Thus, latency in the Viterbi decoder during header decoding affects how quickly the user data can be processed prior to the user data entering the Viterbi decoder.

Accordingly, a new system and method are needed to quickly decode time-sensitive header information.

SUMMARY

The present invention provides a system and method for fast decoding of a front end of data (e.g., a header) that is convolutionally encoded. In an embodiment, the incoming block is compared to all possible codewords in any efficient manner. This step is equivalent to a block decoder. If the block is small enough, it is feasible to also include soft information in the comparison, ensuring that decoding error probabilities remain comparable to what would result from Viterbi decoding of the same segment of data.

The system comprises a receiving device, a block extractor, and a block decoder. The receiving device, such as an antenna or cable, is capable of receiving the convolutionally encoded data. The block extractor is capable of extracting a finite sized block from the front end. The block decoder, which is communicatively coupled to the block extractor, is capable of decoding the extracted block using a block error correction decoding method.

An embodiment of the invention further provides a method for fast decoding of a front end of data (e.g., a header) that is convolutionally encoded. The method comprises: receiving the convolutionally encoded data; extracting a finite sized block from the front end; and decoding the extracted block using a block error correction decoding method.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
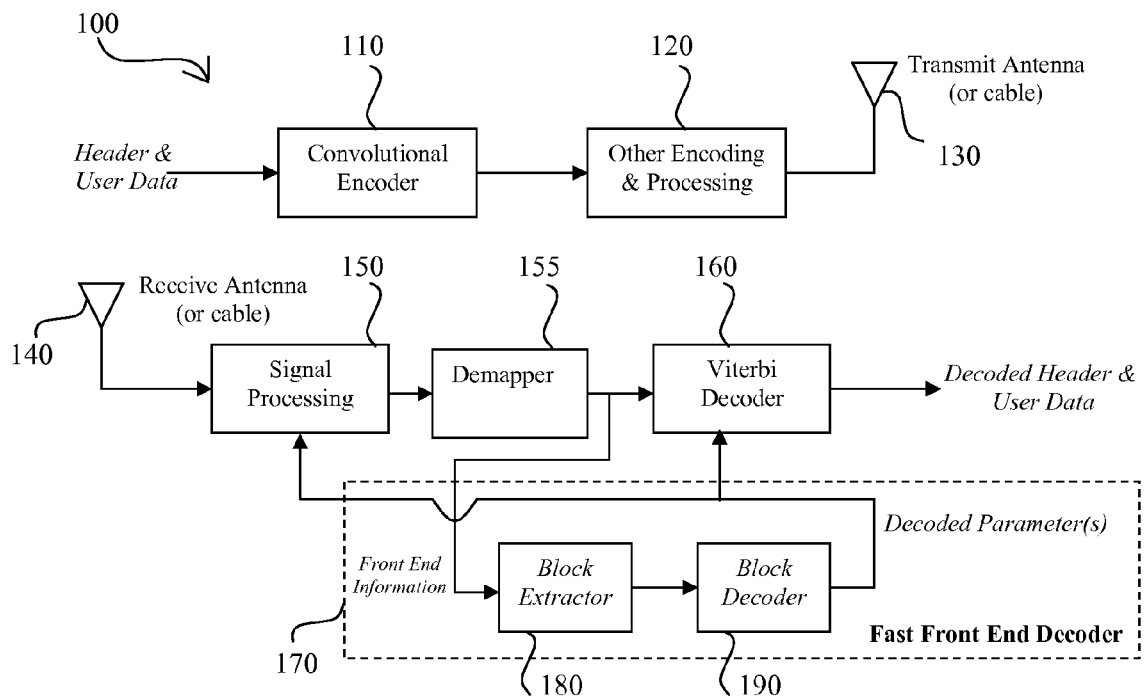
FIG. 1 is a block diagram illustrating a communications system in accordance with an embodiment of the invention.

FIG. 1 is a block diagram illustrating a basic structure of a communications system 100. The communications system 100 includes a transmit section and a receive section. A transmit section of the system 100 includes a convolutional encoder 110 communicatively coupled to an encoding and processing block 120, which is communicatively coupled to a transmit antenna or cable 130. During operation, header information and user data enter the convolutional encoder 110. The output of the encoder 110 is prepared for transmission by an encoding and processing block 120, which may contain a number of digital and analog sub-blocks. The transmit antenna or cable 130 then transmits the encoded and processed output.

The receive section includes a receive antenna or cable 140 (also referred to as a receiving device) communicatively coupled to a signal processing block 150, which is communicatively coupled to a demapper 155, which is in turn communicatively coupled to both a Viterbi decoder 160 and a Fast Front End Decoder 170. In an embodiment of the invention, a deinterleaver (not shown) may be interposed between the demapper 155 and the Viterbi decoder 160. During operation, a data stream enters a receive antenna or cable 140, followed by a signal processing block 150, which may contain a number of analog and digital sub-blocks. After appropriate signal processing, the data stream is demapped to soft or hard samples, and is then ready for both the Viterbi decoder 160 and the fast front end decoder 170. The fast front end decoder 170 can be further divided into a block extractor 180 and a block decoder 190. The block extractor 180 extracts a fixed-size block of information from the front end of the data stream. The block decoder 190 decodes the extracted block using any block error correction decoding method desired, such as directly comparing the received block to all codewords and choosing the codeword that is closest to the received word in terms of Hamming distance or Euclidean distance. Note from FIG. 1 that the fast front end decoder 170 operates in parallel with the Viterbi decoder 160, or other convolutional decoder, such as a sequential decoder, but produces a decoded output much more quickly for the block extracted To illustrate how the fast decoder 170 of convolutionally encoded information works, we will use as an example the convolutional code and header format from one of the physical layer proposals for the IEEE 802.15.3a standard. This is the proposal presented by the WiMedia Alliance, available on their website: www.wimedia.org.

Figure 2:
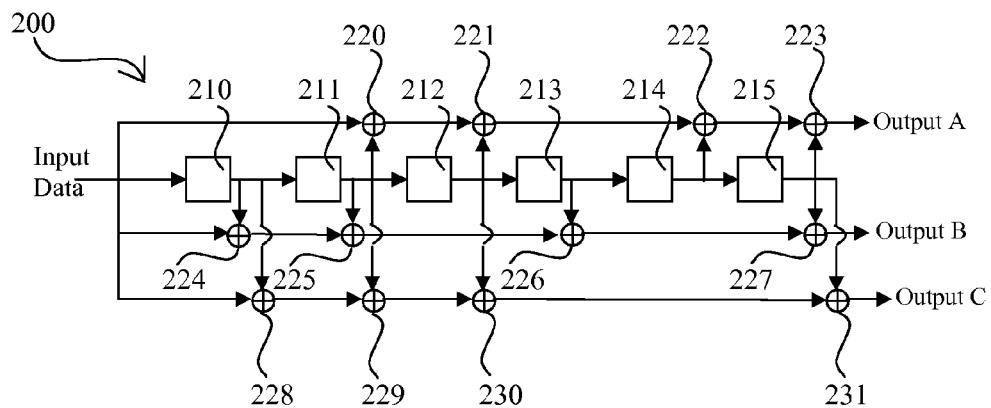
FIG. 2 is a block diagram showing a convolutional encoder according to an embodiment of the invention.

FIG. 2 shows the convolutional encoder 200 used on both the header and user data in the WiMedia standard. The encoder 200 consists of a 6-bit shift register 210-215 and 12 exclusive-OR gates 220-231. The encoder converts each user bit into 3 encoded bits, A, B, and C. User bits enter on the left, and encoded bits are sent out on the right, with bit A being transmitted first, bit B being transmitted second, and bit C being transmitted last. The shift register 210-215 contents at any particular moment indicate the state of the encoder 200.

The very front end of the header in the WiMedia standard includes a code representing the data rate used for transmitting the user data. This data rate is needed early on the receive path to process the user data. There are 8 data rates allowed in the standard, and 5 bits are used for representing the data rates in terms of rate codes. However, only the least significant 3 bits of the rate codes are considered here, because all rate codes have 0s in the most significant 2 bits. In the table below, we show the data rates, the rate codes before convolutional encoding, and the rate codes after convolutional encoding using the circuit in FIG. 2. The encoded rate codes are the codewords to be compared to the corresponding received samples in the fast front end decoder 170.

TABLE 1

Data Rates and Rate Codes from WiMedia Proposed Standard for IEEE 802.15.3a

| Data Rate (Mb/s) | Rate Code (least significant 3 bits) | Rate Code after Convolutional Encoding (Codewords) |
|---|---|---|
| 53.3 | 000 | 000 000 000 |
| 80 | 001 | 000 000 111 |
| 106.7 | 010 | 000 111 011 |
| 160 | 011 | 000 111 100 |
| 200 | 100 | 111 011 111 |
| 320 | 101 | 111 011 000 |
| 400 | 110 | 111 100 100 |
| 480 | 111 | 111 100 011 |

A number of signal processing blocks manipulate the received header prior to the Viterbi decoder 160. The block just before the Viterbi decoder, the demapper 155 will map the processed samples to soft or hard values going into the Viterbi decoder 160. The fast front end decoder 170 can also handle soft or hard values in the decoding process.

For example, if 3-bit soft values are produced by the demapper, the block sent to the fast front end decoder 170 will contain values ranging from 0 through 7, instead of 0 or 1 as shown in Table 1. Here, a soft value of 0 might represent a very good 0 bit, a soft value of 7 might represent a very good 1 bit, and soft values in between would indicate some ambiguity in the bit value. For example, after passing through a noisy channel, a received block might be:

$$020\ 113\ 677. \tag{1}$$

In order to compare this block to the codewords, the codewords need to be converted to soft values themselves. That is, each 1 is changed to a 7 and each 0 is left as is. In this case, the hardware would simply store the codewords in Table 1 with the 1s replaced by 7s. For example, 000 111 100 would be stored in the hardware as 000 777 700. With this change, the above received block can be compared to each codeword by finding the Euclidean distance between the received block and the codeword. In general, the Euclidean distance is computed as follows:

$$\text{distance}([c_1 c_2 c_3 c_4 c_5 c_6 c_7 c_8 c_9], [r_1 r_2 r_3 r_4 r_5 r_6 r_7 r_8 r_9]) = \sum_{i=1}^{9} |c_i - r_i|, \tag{2}$$

where $[c_1 c_2 c_3 c_4 c_5 c_6 c_7 c_8 c_9]$ is the codeword (after conversion to soft values) and $[r_1 r_2 r_3 r_4 r_5 r_6 r_7 r_8 r_9]$ is the received block or received word. For example, comparison of the received block in equation (1) to the second codeword in Table 1 yields:

$$\text{distance}(020\ 113\ 677, 000\ 000\ 777) = 0+2+0+1+1+3+1+0+0 = 8. \tag{3}$$

In other embodiments of the invention, soft values with more or fewer than 3 bits can be employed, including the so-called hard value case that uses just 1 bit (0s and 1s). For the hard value case, Hamming distance can be used in place of Euclidean distance.

Once the received block is compared to each codeword, the resulting values of Euclidean distance are compared. The codeword that yields the smallest Euclidean distance indicates which data rate was encoded in the header. This is the data rate then used for further processing of the user data following the header, i.e., by the Viterbi decoder 160 and Signal Processing block 150.

In another embodiment of the invention, comparison to all the allowed codewords can be accomplished indirectly using any method generally employed in the correction of block codes.

Returning to the example from the WiMedia standard, not all data rates listed in Table 1 need to be supported by all devices. For example, the WiMedia standard specifies data rates of 53.3, 106.7, and 200 Mb/s as mandatory. For a device supporting only these data rates, the fast front end decoder 170 can be simplified and have its performance improved if only the three codewords for these mandatory data rates are employed in the decoder 170. This will result in a fast front end decoder performance that exceeds that of the Viterbi decoder 160 operating on that short block, because the Viterbi decoder 160 cannot take into account the fact that only three data rates are allowed. In this embodiment of the invention, the Hamming distance of the block code—a measure of how powerful the code is, measured by counting the number of places in which the two closest codewords differ—increases from a distance of 3 if all codewords are used, to a distance of 5 if only the codewords for the mandatory rates are used. This indicates a more powerful code with improved error rate performance.

While embodiments of the invention have been disclosed for operating on the front end of a data stream, embodiments could also be applied to the middle or other sections of the data stream if certain criteria are met. In particular, the state of the encoder—that is, the contents of the shift register—of FIG. 2 would need to be fixed and known. For example, if it is known that all the bits stored in the encoder are zeros (such as after a reset or if the bits fed to the encoder were zeros), then a fast block decoder is feasible for the bits immediately after those zeros.

Figure 3:
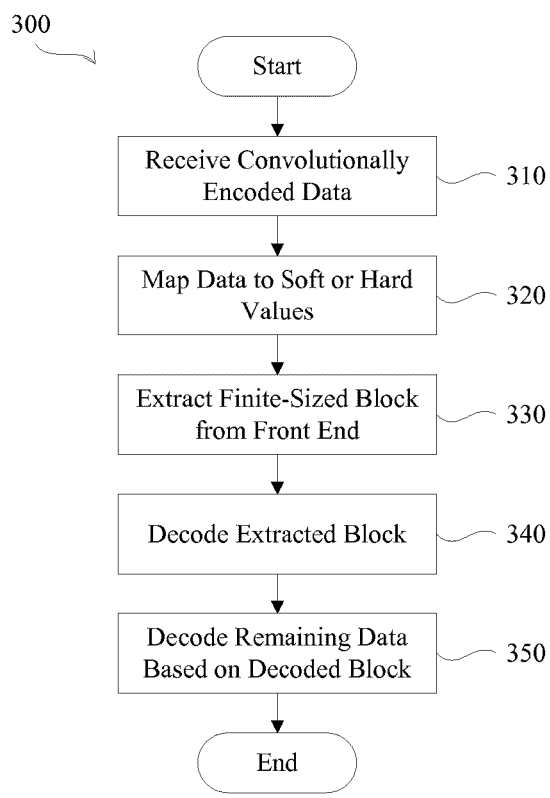
FIG. 3 is a flowchart illustrating a method of decoding data.

FIG. 3 is a flowchart illustrating a method 300 of decoding data. First, convolutionally encoded data is received (310). The received data can then be mapped (320) to soft or hard values. A finite-sized block of data is then extracted (330) from the front end of the mapped data (e.g., header data). The extracted block is then decoded (340) using a block error correction decoding method. The decoding (340) will be discussed in further detail in conjunction with FIG. 4 below. The remaining data is then decoded (350) based on the decoding (340). The method 300 then ends.

Figure 4:
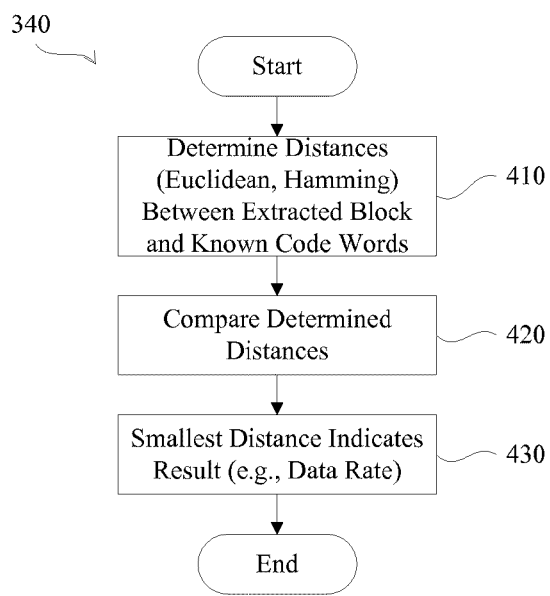
FIG. 4 is a flowchart illustrating a method of decoding a front end of the data.

FIG. 4 is a flowchart illustrating a method 340 of decoding the front end of the data. First, distances are determined (410) between the extracted block and known codewords. If the extracted block is in soft values, then the known codewords should be stored in the same format or converted if not in the same format. The distances can be determined (410) using Euclidean or Hamming techniques, for example. The determined distances are then compared (420) and the smallest distance indicates (430) the decoded result, such as data rate, which can then be used for further decoding of the remaining data. The method 340 then ends.

The foregoing description of the illustrated embodiments of the present invention is by way of example only, and other variations and modifications of the above-described embodiments and methods are possible in light of the foregoing teaching. For example, other decoders besides a Viterbi decoder can be used. Components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. A method of decoding a finite sized block of convolutionally encoded data, comprising:
   receiving the convolutionally encoded data;
   extracting a finite sized block from the data, wherein the finite sized block is less than the entire received data; and
   decoding the extracted block using a block error correction decoding method, wherein the decoding includes:
   determining distances between the extracted block and known codewords; and
   comparing the distances such that the comparison having the smallest distance indicates the result.

2. The method of claim 1, further comprising mapping the extracted block to soft values.

3. The method of claim 1, further comprising decoding a remainder of the convolutionally encoded data based on the decoded block using a Viterbi decoder.

4. The method of claim 1, wherein the comparing includes using a Euclidean technique.

5. The method of claim 1, wherein the comparing includes using a Hamming technique.

6. The method of claim 1, further comprising converting the known codewords to soft values.

7. The method of claim 1, wherein the decoded extracted block indicates a data rate.

8. The method of claim 1, wherein the finite sized block includes a front end of the data.

9. The method of claim 1, wherein the convolutionally encoded data is for a physical layer.

10. A system for decoding a finite sized block of convolutionally encoded data, comprising:
    means for receiving the convolutionally encoded data;
    means for extracting a finite sized block from the data, wherein the finite sized block is less than the entire received data; and
    means for decoding the extracted block using a block error correction decoding method, wherein the decoding includes:
    determining distances between the extracted block and known codewords; and
    comparing the distances such that the comparison having the smallest distance indicates the result.

11. A system of decoding a finite sized block of convolutionally encoded data, comprising:
    a receiving device capable of receiving the convolutionally encoded data;
    a block extractor capable of extracting a finite sized block from the data, wherein the finite sized block is less than the entire received data; and
    a block decoder, communicatively coupled to the block extractor, capable of decoding the extracted block using a block error correction decoding method, wherein the block decoder decodes by:
    determining distances between the extracted block and known codewords; and
    comparing the distances such that the comparison having the smallest distance indicates the result.

12. The system of claim 11, further comprising a demapper capable of mapping the extracted block to soft values.

13. The system of claim 11, further comprising a Viterbi decoder capable of decoding a remainder of the convolutionally encoded data based on the decoded block.

14. The system of claim 11, wherein the comparing includes using a Euclidean technique.

15. The system of claim 11, wherein the comparing includes using a Hamming technique.

16. The system of claim 11, further comprising a demapper capable of converting the known codewords to soft values.

17. The system of claim 11, wherein the decoded extracted block indicates a data rate.

18. The system of claim 11, wherein the finite sized block includes a front end of the data.

* * * * *